(12) United States Patent
Kohashi

(10) Patent No.: US 7,589,399 B2
(45) Date of Patent: Sep. 15, 2009

(54) SEMICONDUCTOR DEVICE, LEAD FRAME USED IN THE SEMICONDUCTOR DEVICE AND ELECTRONIC EQUIPMENT USING THE SEMICONDUCTOR DEVICE

(75) Inventor: Ikuo Kohashi, Gojo (JP)

(73) Assignee: Sharp Kabushiki Kaisha, Osaka (JP)

( * ) Notice: Subject to any disclaimer, the term of this patent is extended or adjusted under 35 U.S.C. 154(b) by 148 days.

(21) Appl. No.: 11/507,004

(22) Filed: Aug. 21, 2006

(65) Prior Publication Data

US 2007/0052073 A1 Mar. 8, 2007

(30) Foreign Application Priority Data

Aug. 26, 2005 (JP) ............................. 2005-245845

(51) Int. Cl.
*H01L 23/495* (2006.01)
(52) U.S. Cl. ..................................... 257/666; 257/795
(58) Field of Classification Search ................. 257/666, 257/676, 789, 795, 773
See application file for complete search history.

(56) References Cited

U.S. PATENT DOCUMENTS

| | | | |
|---|---|---|---|
| 6,492,707 | B1 | 12/2002 | Kaku et al. |
| 7,023,098 | B2 * | 4/2006 | Umeno et al. ................ 257/787 |
| 2004/0000728 | A1 * | 1/2004 | Kurafuchi et al. ........... 257/787 |
| 2006/0060882 | A1 * | 3/2006 | Ohe et al. .................... 257/100 |

FOREIGN PATENT DOCUMENTS

| | | |
|---|---|---|
| JP | 45-1137 A | 1/1970 |
| JP | 51-156763 U | 12/1976 |
| JP | 55-3641 A | 1/1980 |
| JP | 59061950 A | 4/1984 |
| JP | 63-167750 U | 11/1988 |
| JP | 4-188859 A | 7/1992 |
| JP | 6-224357 A | 8/1994 |
| JP | 7245420 A | 9/1995 |
| JP | 7311172 A | 11/1995 |
| JP | 8-88313 A | 4/1996 |
| JP | 11-186486 A | 7/1999 |
| JP | 11-297918 A | 10/1999 |
| JP | 2002-110886 A | 4/2002 |
| JP | 2004-200350 A | 7/2004 |

* cited by examiner

*Primary Examiner*—S. V Clark
(74) *Attorney, Agent, or Firm*—Birch, Stewart, Kolasch & Birch, LLP

(57) ABSTRACT

A semiconductor chip 23 is mounted on an island section 22 in a lead frame composed of a lead having the island section 22, a ground-bonding lead section 28 and a lead 21a each continuing in sequence, and other lead terminal sections 21b to 21d, and then a grounding electrode 24a and other electrodes 24b to 24d for the semiconductor chip are respectively wire-bonded to the lead 21a and other lead terminals 21b to 21d by gold wires 25a to 25d before being embedded in a resin to form a package 27. The lead with the semiconductor chip 23 mounted thereon is structured so that the ground-bonding lead section 28 continuing to both the lead 21a and the island section 22 are absent on both the sides of the wire-bonding region 28a with respect to the island section 22 in the longitudinal section along the grounded gold wire 25a.

15 Claims, 7 Drawing Sheets

SEMICONDUCTOR DEVICE, LEAD FRAME USED IN THE SEMICONDUCTOR DEVICE AND ELECTRONIC EQUIPMENT USING THE SEMICONDUCTOR DEVICE

CROSS-REFERENCE TO RELATED APPLICATIONS

This nonprovisional application claims priority under 35 U.S.C. §119(a) on Patent Application No(s). 2005-245845 filed in Japan on Aug. 26, 2005, the entire contents of which are hereby incorporated by reference.

BACKGROUND OF THE INVENTION

The present invention relates to a semiconductor device, which is applicable to, for example, optical communication apparatuses, a lead frame used in the semiconductor device, and electronic equipment using the semiconductor device.

Conventionally, there have been semiconductor devices having a resin-sealed package structure as disclosed in JP S59-61950 A, JP H07-245420 A and JP H07-311172 A. The overview of these semiconductor devices having the resin-sealed package structure is shown in FIG. 11. FIG. 11 is a perspective view as viewed from the top, in which a semiconductor chip 3 is mounted on an island section (die pad) 2 of a lead 1a in a planar lead frame, and wire-bonding electrodes 4a to 4d provided on the surface of the semiconductor chip 3 are connected to leads 1a to 1d, respectively, through wire bonding by gold wires 5a to 5d. Further, the semiconductor chip 3, the gold wires 5a to 5d and the leads 1a to 1d are sealed by a resin 6 to constitute a package 7. The leads 1a to 1d respectively have holes 8a to 8d formed to prevent slipping out of the package 7.

In the case where the electrode 4a among the wire-bonding electrodes 4a to 4d provided on the surface of the semiconductor chip 3 is a ground-bonding electrode, the ground-bonding electrode 4a is wire-bonded (ground-bonded) by the gold wire 5a to a ground-bonding lead section 9 provided in the lead 1a and continuing to the island section 2.

FIG. 12 is a cross sectional view taken along an arrow line A-A' along the ground-bonded gold wire 5a in FIG. 11. As shown in FIG. 12, the lead 1a is continuously structured in the cross section along the ground-bonded gold wire 5a.

The gold wire 5a subject to the ground bonding is wire-bonded to the ground-bonding lead section 9 continuing to the island section 2. Since the ground-bonding lead section 9 is formed wider than a lead terminal section continuing to the ground-bonding lead section 9, frame clamping during wire bonding can reliably be achieved, resulting in the attainment of a good bonding state of the gold wire 5a compared to other gold wires 5b to 5d.

However, the conventional semiconductor devices have a following problem. That is, as described above, the gold wire 5a subject to ground bonding can attain a good bonding state compared to other gold wires 5b to 5d, and yet, a heat cycle test, which is a reliability test, has indicated that a bonding section of the gold wire 5a (hereinbelow also referred to as a ground wire) subject to the ground bonding is more susceptible to open failures than the bonding sections of other gold wires 5b to 5d.

Hereinbelow, the reason why the bonding section of the gold wire 5a that is a ground wire is more susceptible to open failures will be described with reference to FIG. 13 that is a cross sectional view taken along the arrow line A-A' in FIG. 11.

The package 7 incorporates a lead 1a, a semiconductor chip 3, a gold wire 5a and a resin 6, each of which has a different coefficient of linear expansion, and the stress corresponding to amounts of difference in the coefficient of linear expansion is generated in interfaces between each other in response to temperature changes.

The lead 1a has the longest continuous structure in the package 7, which is sealed by the resin 6, in the cross section along the ground-bonded gold wire 5a. Consequently, the lead 1a expands and contracts most in the cross sectional direction along the ground-bonded gold wire 5a, i.e., the direction of an arrow 10 parallel to the lead 1a, by temperature changes. The resin 6 constituting the package 7 also expands and contracts most in the direction of an arrow 11 parallel to the lead 1a.

As a result, the stress which is generated in response to temperature changes in between the resin 6 and the lead 1a constituting the package 7 due to a difference in coefficient of linear expansion becomes the largest stress generated in the package 7. The stress is exerted on a contact face between the semiconductor chip 3 and the resin 6 as well as on a contact face between a portion of the lead 1a on the outer side of the ground-bonding lead section 9 and the resin 6. In the portion of these faces where two objects in contact with each other are poor in adhesion, a side slip occurs, that is, these two objects are relatively dislocated along these faces, and this relaxes the stress. In this case, a side slip generated by the heat cycle test makes a reciprocating motion, and when the side slip is generated in a bonding portion of the gold wire 5a, the gold wire 5a moves together with the resin 6 in the state of being embedded in the resin 6. Therefore, even a minor side slip causes the bonding section of the gold wire 5a to be broken.

It is to be noted that the coefficient of linear expansion of the leads 1a to 1d is $1.7 \times 10^{-5}$ in the case where their material is copper based. The coefficient of linear expansion of the resin 6 depends on the amount of fillers contained but is generally about $4.0 \times 10^{-5} \sim 6.0 \times 10^{-5}$. Therefore, the resin 6 is larger in coefficient of linear expansion than the leads 1a to 1d. Sealing by the resin 6 is performed at high temperatures of 150° C. to 300° C. in the case of using thermosetting resins and thermoplastics resins. Therefore, in view of the fact that the stress generated between the resin 6 and the lead 1a at a setting temperature of the resin 6 is zero, it is found that stress is generated upon contraction of the resin 6 against the lead 1a in the temperature range of the heat cycle test "about −40° C. to 120° C.".

It is to be noted that the coefficient of linear expansion of the gold wire 5a is $1.4 \times 10^{-5}$, which is smaller than the coefficient of linear expansion of the resin 6. Therefore, the gold wire 5a constituting the package 7 in the state of being sealed by the resin 6 is constantly and substantially equally compressed by the surrounding and is subjected to stress. Therefore, unless the side slide occurs in the bonding portion of the gold wire 5a, the gold wire 5a will not easily be broken.

Further, FIG. 13 shows, in view of a difference in coefficient of linear expansion between the lead 1a and the resin 6, it is understood that in the temperature range of the heat cycle test "about −40° C. to 120° C.", stress is applied to the resin 6 in the direction of contraction against the lead 1a and that the stress changes as the heat cycle test temperature changes.

Assuming that the material of the lead 1a is a copper based alloy (coefficient of linear expansion=$1.7 \times 10^{-5}$), the material of the resin 6 is a thermosetting epoxy resin (coefficient of linear expansion=$4.0 \times 10^{-5}$) containing fillers, and the length of the lead 1a being linearly and continuously in contact with the land 6 in the package 7 is 10 mm, relative displacement between the lead 1a and the resin 6 generated at a temperature range of the heat cycle test 160° C. by the difference in coefficient of linear expansion amounts to 36.8 µm, and during the heat cycle test, the stress causing this relative displacement cyclically acts upon between the lead 1a and the resin 6. Therefore, when the stress becomes reciprocating drive force of a side slip relatively generated between the lead 1a and the resin 6, the side slip, even if minor, ends up breaking the gold wire 5a in the bonding section to the lead 1a or in the bonding section of the electrode 4a on the semiconductor chip 3.

SUMMARY OF THE INVENTION

An object of the present invention is to provide a highly reliable semiconductor device having a resin-sealed package structure and being capable of eliminating wire-bonding failures to a lead having an island section on which a semiconductor chip is to be mounted, a lead frame used in the semiconductor device, and electronic equipment using the semiconductor device.

In order to achieve the above object, there is provided a semiconductor device, comprising:

a lead including an island section with a semiconductor chip mounted thereon, a bonding lead section continuing to the island section, and a lead terminal section continuing to the bonding lead section;

a wire for electrically connecting an electrode provided on the semiconductor chip and the bonding lead section; and a resin sealing the semiconductor chip, the lead and the wire and containing a filler of 20 weight % or more and 90 weight % or less, wherein in a cross section which is vertical to a mounting surface of the semiconductor chip in the island section and which is along the wire, a cross section of the resin continuing to a cross section of the bonding lead section appears on the side of the bonding lead section opposite to the island section.

According to the structure, in the longitudinal section along the wire which electrically connects the electrode of the semiconductor chip and the bonding lead section, the lead continuing to the bonding lead section is absent on the side of the bonding lead section opposite to the island section. Therefore, the length of a portion of an interface between the lead and the sealing resin, the portion in which stress is generated by a difference in coefficient of linear expansion therebetween in the direction along the wire, is shortened, and so the stress applied to a bonding section of the wire in the lead is decreased. As a result, it becomes possible to prevent breakage due to changes in ambient temperature from occurring in the bonding section of the wire in the lead or in the semiconductor chip.

The resin sealing the semiconductor chip, the lead and the wire contains a filler of 20 weight % or more. Therefore, the coefficient of linear expansion of the resin can be decreased from that in the case without the filler and can be closer to the coefficient of linear expansion of the lead. As a result, breakage occurring in the bonding section of the wire can be prevented more reliably. Further, a content of the filler in the resin is 90 weight % or more. This can provide the resin with translucency sufficient enough for optical semiconductor devices to fully function.

In one embodiment of the invention, the filler has a generally spherical shape with a smooth surface.

According to the embodiment, the filler has a generally spherical shape with a smooth surface. Therefore, it becomes possible to suppress diffuse reflection on the surface of the filler and to decrease degradation in the translucency of the resin attributed to the shape of the filler.

In one embodiment of the invention, in a cross section which is vertical to a mounting surface of the semiconductor chip in the island section and which is along the wire, a cross section of the resin continuing to a cross section of the bonding lead section appears at the bonding lead section on a side of the island section.

According to the embodiment, in the longitudinal section along the wire which electrically connects an electrode of the semiconductor chip and the bonding lead section, the lead continuing to the bonding lead section is absent not only on the side of the bonding lead section opposite to the island section but also at the bonding lead section on the side of the island section. This further shortens the length of a portion of an interface between the bonding section of the wire in the lead and the sealing resin, the portion in which stress is generated by a difference in coefficient of linear expansion therebetween in the direction along the wire, compared to the case where the lead continuing to the bonding lead section is absent only on the side of the bonding lead section opposite to the island section, and so the generated stress can be decreased further. As a result, it becomes possible to further suppress occurrence of breakage in the bonding section of the wire in the lead or in the semiconductor chip.

In one embodiment of the invention, the bonding lead section includes:

a first linear section formed in a linear shape and having one end connected to the island section; and a second linear section formed in a linear shape and having one end connected to the other end section of the first linear section so as to extend along the island section, wherein the one end side of the second linear section is connected to the lead terminal section while a top end portion of the second linear section has a wire-bonding region for connecting the wire.

According to the embodiment, the wire-bonding region provided in the top end portion of the second linear section protrudes more than the lead terminal section in a direction intersecting with an extending direction of the lead terminal section. Therefore, the lead continuing to the wire-bonding region is absent on the side of the wire-bonding region opposite to the island section in the longitudinal section along the wire. Further, the lead continuing to the wire-bonding region is also absent at the wire-bonding region on the side of the island section in the longitudinal section along the wire. Therefore, the length of a portion of an interface between the bonding section of the wire in the lead and the sealing resin, the portion in which stress is generated by a difference in coefficient of linear expansion therebetween in the direction along the wire, can be made as short as the width of the second linear section, and so the generated stress can be decreased.

In one embodiment of the invention, the bonding lead section includes:

a first linear section formed in a linear shape and having one end connected to the island section;

a second linear section formed in a linear shape and having one end connected to the other end section of the first linear section so as to extend along the island section, and a third linear section formed in a linear shape and having one end connected to the other end section of the second linear section so as to extend toward the island section, wherein the one end side of the second linear section is connected to the lead terminal section, and wherein a top end potion of the third linear section has a wire-bonding region provided for connecting the wire.

According to the embodiment, the wire-bonding region provided in the top end portion of the third linear section protrudes more than the lead terminal section in a direction intersecting with an extending direction of the lead terminal section. Therefore, the lead continuing to the wire-bonding region is absent on the side of the wire-bonding region opposite to the island section in the longitudinal section along the wire. Further, the lead continuing to the wire-bonding region is also absent at the wire-bonding region on the side of the island section in the longitudinal section along the wire. Therefore, the length of a portion of an interface between the bonding section of the wire in the lead and the sealing resin, the portion in which stress is generated by a difference in coefficient of linear expansion therebetween in the direction along the wire, can be made as short as the width of the third linear section, and so the generated stress can be decreased.

In one embodiment of the invention, the bonding lead section is structured so that four or more linear sections formed in a linear shape are linked in a spiral shape, a top end of the outermost linear section positioned at a forefront among a plurality of the linear sections linked in a spiral shape is connected to the island section, and the linear section farthest from the island section among a plurality of the linear sections linked in a spiral shape is connected to the lead terminal section, and wherein a top end portion of the innermost linear section positioned at a rear among a plurality of the linear sections linked in a spiral shape has a wire-bonding region provided for connecting the wire.

According to the embodiment, the wire-bonding region, which is provided in the top end portion of the innermost linear section positioned at the rear among a plurality of the linear sections linked in a spiral shape, protrudes more than the lead terminal section in a direction intersecting with the extending direction of the lead terminal section. Therefore, the lead continuing to the wire-bonding region is absent on the side of the wire-bonding region opposite to the island section in the longitudinal section along the wire. Further, the lead continuing to the wire-bonding region is also absent on the side of the wire-bonding region near the island section in the longitudinal section along the wire. Therefore, the length of a portion of an interface between the bonding section of the wire in the lead and the sealing resin, the portion in which stress is generated by a difference in coefficient of linear expansion therebetween in the direction along the wire, can be made as short as the width of the innermost linear section positioned at the rear, and so the generated stress can be decreased.

In one embodiment of the invention, the bonding lead section is structured so that a side of a rectangular body which is wider than a side of the lead terminal section is connected to the lead terminal section while a side opposite to the side is connected to the island section, and that the rectangular body has a rectangular through hole provided along the island section, and wherein a wire-bonding region for connecting the wire is provided in a region of the rectangular body facing the island section across the through hole excluding a connection portion to the lead terminal section and a connection portion to the island section.

According to the embodiment, the wire-bonding region provided in a portion facing the island section across the rectangular through hole protrudes more than the lead terminal section in a direction intersecting with the extending direction of the lead terminal section. Therefore, the lead continuing to the wire-bonding region is absent on the side of the wire-bonding region opposite to the island section in the longitudinal section along the wire. Further, the lead continuing to the wire-bonding region is also absent at the wire-bonding region on the side of the island section in the longitudinal section along the wire. Therefore, the length of a portion of an interface between the bonding section of the wire in the lead and the sealing resin, the portion in which stress is generated by a difference in coefficient of linear expansion therebetween in the direction along the wire, can be made as short as the width of the portion facing the island section across the through hole, and so the generated stress can be decreased.

In one embodiment of the invention, the bonding lead section is structured so that a side of a rectangular body which is wider than a side of the lead terminal section is connected to the lead terminal section while a side opposite to the side is connected to the island section, and that the rectangular body has two rectangular through holes provided along the island section, and wherein a wire-bonding region for connecting the wire is provided in a region between the two through holes in the rectangular body excluding a connection portion to the island section.

According to the embodiment, the wire-bonding region provided in a portion between two through holes in the rectangular body protrudes more than the lead terminal section in a direction intersecting with the extending direction of the lead terminal section. Therefore, the lead continuing to the wire-bonding region is absent on the side of the wire-bonding region opposite to the island section in the longitudinal section along the wire. Further, the lead continuing to the wire-bonding region is also absent at the wire-bonding region on the side of the island section in the longitudinal section along the wire. Therefore, the length of a portion of an interface between the bonding section of the wire in the lead and the sealing resin, the portion in which stress is generated by a difference in coefficient of linear expansion therebetween in the direction along the wire, can be made as short as the width of the portion between these two through holes, and so the generated stress can be decreased.

In one embodiment of the invention, the bonding lead section has a wire-bonding region for connecting the wire, and wherein a width of the wire-bonding region is 0.3 mm or more and 0.6 mm or less.

According to the embodiment, setting the width of the wire-bonding region at 0.3 mm or more and 0.6 mm or less can secure the region allowing bonding by the wire. At the same time, minor stress generated in an interface between the wire-bonding region and the resin is relaxed by deformation of the wire-bonding region in the direction along the wire, the deformation being small enough to prevent breakage of the wire. Therefore it becomes possible to prevent the stress from being applied to the bonding portion of the wire in the wire-bonding region.

In one embodiment of the invention, a size of the semiconductor chip is 0.5 mm or more and 2.5 mm or less on a side and is 0.1 mm or more and 0.4 mm or less in thickness.

The surface of the semiconductor chip has poor adhesiveness to the resin, and therefore side slips tend to occur by stress in an interface between the semiconductor chip and the resin. Further, the larger the size of the semiconductor chip is, the more noticeable the occurrence of side slips by the stress becomes. According to the embodiment, the length of a portion of the lead with the semiconductor chip mounted thereon along the wire can be made as short as the width of the island section. Consequently, it becomes possible to decrease the stress generated between the portion of the lead with the semiconductor chip mounted thereon and the resin due to a difference in coefficient of linear expansion therebetween and to decrease further the stress generated in an interface between the semiconductor chip and the resin.

Therefore, even in the case of mounting a semiconductor chip as large as 0.5 mm or more and 2.5 mm or less on a side, occurrence of side slips in an interface between the semiconductor chip and the resin can be suppressed and the reliability of the bonding section of the wire in the semiconductor chip can be ensured.

Also, there is provided a lead frame used in the above semiconductor device comprising:

an island section on which a semiconductor chip is to be mounted;

a bonding lead section which continues to the island section and which is to be electrically connected to an electrode provided on the semiconductor chip by a wire; and a lead terminal section continuing to the bonding lead section and extending on an opposite side of the island section, wherein in a cross section which is vertical to a mounting surface of the semiconductor chip in the island section and which goes through the bonding lead section and the island section, the bonding lead section has a region not continuing to the island section and to the lead terminal section.

According to the structure, by setting a region of the bonding lead section not continuing to the island section and the lead terminal section as a wire-bonding region for connecting the wire, when a semiconductor device is formed by the steps of mounting the semiconductor chip on the island section, electrically connecting an electrode of the semiconductor chip and the wire-bonding region by the wire, and sealing the semiconductor chip, the island section and the wire by a resin, it becomes possible to structure so that on both the sides of the wire-bonding region opposite to the island section and near the island section in the longitudinal section along the wire, the wire-bonding region does not continue to the island section and the lead terminal section. Therefore, the length of a portion of an interface between the bonding section of the wire in the lead and the sealing resin, the portion in which stress is generated by a difference in coefficient of linear expansion therebetween in the direction along the wire, can be shortened, and so the generated stress can be decreased. As a result, it becomes possible to prevent breakage due to changes in ambient temperature from occurring in the bonding section of the wire in the lead.

In one embodiment of the invention, the region of the bonding lead section not continuing to the island section and to the lead terminal section is constituted of a protruding section away from the island section and protruding more than the lead terminal section in a direction intersecting with an extending direction of the lead terminal section.

According to the embodiment, a region of the bonding lead section not continuing to the island section and to the lead terminal section can easily be formed by providing the bonding lead section with the protruding section.

In one embodiment of the invention, the bonding lead section has a through hole extending along the island section, and wherein the region of the bonding lead section not continuing to the island section and to the lead terminal section is constituted of a region facing the island section across the through hole.

According to the embodiment, a region of the bonding lead section not continuing to the island section and to the lead terminal section can easily be formed by providing the bonding lead section with the through hole.

In one embodiment of the invention, the lead frame including the island section, the bonding lead section and the lead terminal section is formed from a copper-based or iron-based alloy, and wherein at least a region of the bonding lead section to which the wire is connected is given plating suitable for wire bonding.

According to the embodiment, bonding of the wire to the bonding lead section can be achieved more reliably and occurrence of breakage of the bonding section of the wire can be prevented even more reliably.

In one embodiment of the invention, electronic equipment using the above semiconductor device.

According to the structure, the electronic equipment uses a highly reliable semiconductor device capable of eliminating wire-bonding failures generated due to a difference in coefficient of linear expansion between a lead with a semiconductor chip mounted thereon and a sealing resin in response to temperature changes. Therefore, it becomes possible to provide highly reliable electronic equipment usable under an environment with a wide temperature range.

As is clear from the description above, in the semiconductor device of the present invention, the lead continuing to the bonding lead section is absent on the side of the bonding lead section opposite to the island section in the longitudinal section along the wire which electrically connects an electrode of the semiconductor chip and the bonding lead section, and this can shorten the length of a portion of an interface between the lead and the sealing resin, the portion in which stress is generated by a difference in coefficient of linear expansion therebetween in the direction along the wire. Therefore, it becomes possible to decrease the stress applied to the is bonding section of the wire in the lead and to prevent breakage due to changes in ambient temperature from occurring in the bonding section of the wire.

Further, the resin sealing the semiconductor chip, the lead and the wire contains a filler of 20 weight % or more. Therefore, the coefficient of linear expansion of the resin can be made closer to the coefficient of linear expansion of the lead, so that occurrence of breakage in the bonding section of the wire can be prevented more reliably. Further, a content of the filler in the resin is 90 weight % or more. This can provide the resin with translucency sufficient enough for optical semiconductor devices to fully function.

Therefore, according to the present invention, it becomes possible to eliminate wire-bonding failures generated due to a difference in coefficient of linear expansion between a lead with a semiconductor chip mounted thereon and a sealing resin in response to temperature changes so that a highly reliable semiconductor can be provided.

Further, in the longitudinal section along the wire which electrically connects an electrode of the semiconductor chip and the bonding lead section, if the lead continuing to the bonding lead section is made absent also on the side of the bonding lead section near the island section, the length of a portion of an interface between the bonding section of the wire in the lead and the resin, the portion in which stress is generated by a difference in coefficient of linear expansion therebetween in the direction along the wire, can be shortened further. Therefore, it becomes possible to further decrease generated stress and to further suppress occurrence of breakage in the bonding section of the wire.

Moreover, in the lead frame of the invention, the bonding lead section continuing to the island section on which the semiconductor chip is to be mounted and which is to be electrically connected to an electrode of the semiconductor chip by the wire is, in the cross section going through the bonding lead section and island section, provided with a region not continuing to the island section and to the lead terminal section. Consequently, by setting the region of the bonding lead section not continuing to the island section and to the lead terminal section as the wire-bonding region, it becomes possible to structure so that on both the sides of the wire-bonding region opposite to the island section and near the island section in the longitudinal section along the wire, the wire-bonding region does not continue to the island section and to the lead terminal section when a resin-sealing semiconductor device is formed.

Therefore, the length of a portion of an interface between the bonding section of the wire in the lead and the sealing resin, the portion in which stress is generated by a difference in coefficient of linear expansion therebetween in the direction along the wire, can be shortened, and so the generated stress can be decreased. As a result, it becomes possible to prevent breakage due to changes in ambient temperature from occurring in the bonding section of the wire in the lead.

Moreover, the electronic equipment of the present invention uses the semiconductor device of the present invention. Therefore, by using the highly reliable semiconductor device capable of eliminating wire-bonding failures generated due to a difference in coefficient of linear expansion between a lead and a sealing resin in response to temperature changes, it becomes possible to provide highly reliable electronic equipment usable under an environment with a wide temperature range.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

Hereinbelow, the invention will be described in detail with reference to the accompanying drawings.

FIRST EMBODIMENT

Figure 1:
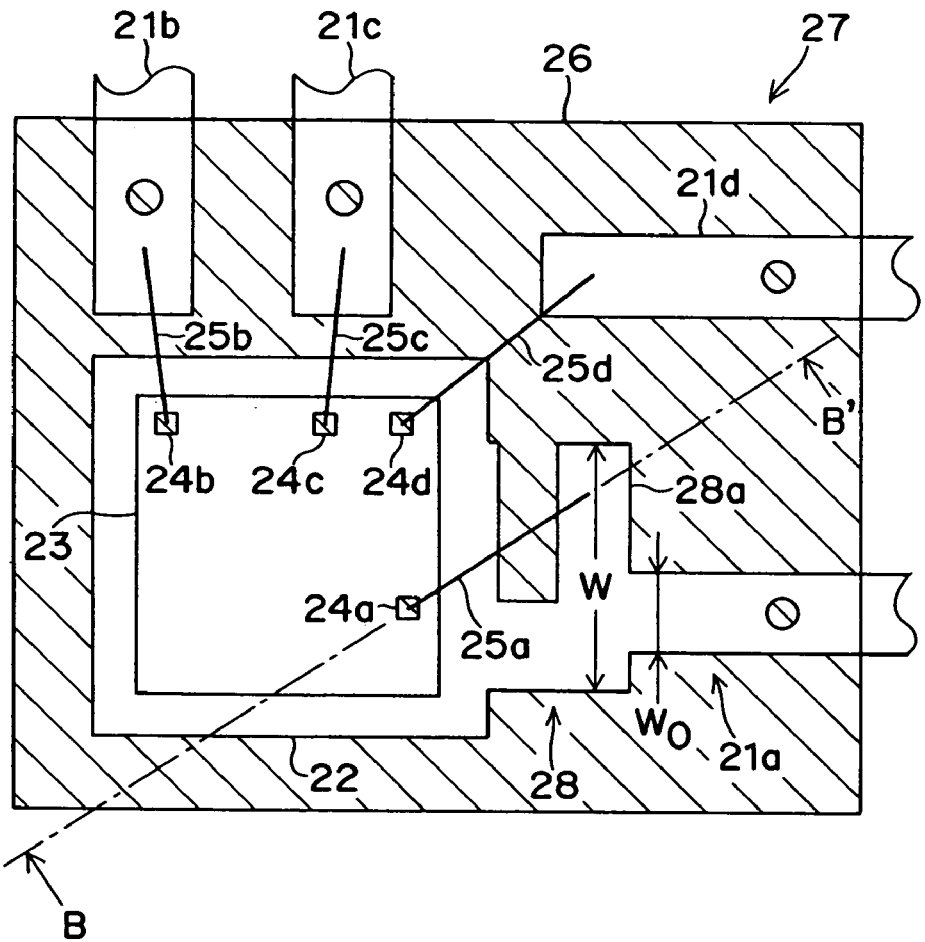
FIG. 1 is a perspective view showing a semiconductor device of the present invention as viewed from the top.

FIG. 1 is a perspective view showing a semiconductor device of the present invention as viewed from the top. In FIG. 1, a semiconductor chip 23 is mounted on an island section (die pad) 22 of a lead 21a in a planar lead frame, and wire-bonding electrodes 24a to 24d provided on the surface of the semiconductor chip 23 are connected to leads 21a to 21d, respectively, through wire bonding by gold wires 25a to 25d. Further, the semiconductor chip 23, the gold wires 25a to 25d and the leads 21a to 21d are sealed by a resin 26 containing a filler of 20 weight % or more and 90 weight % or less to constitute a package 27.

In the case where the electrode 24a among the wire-bonding electrodes 24a to 24d provided on the surface of the semiconductor chip 23 is a ground-bonding electrode, the ground-bonding electrode 24a is wire-bonded (ground-bonded) by the gold wire 25a to a ground-bonding lead section 28 provided in the lead 21a and continuing to the island section 22.

Figure 2:
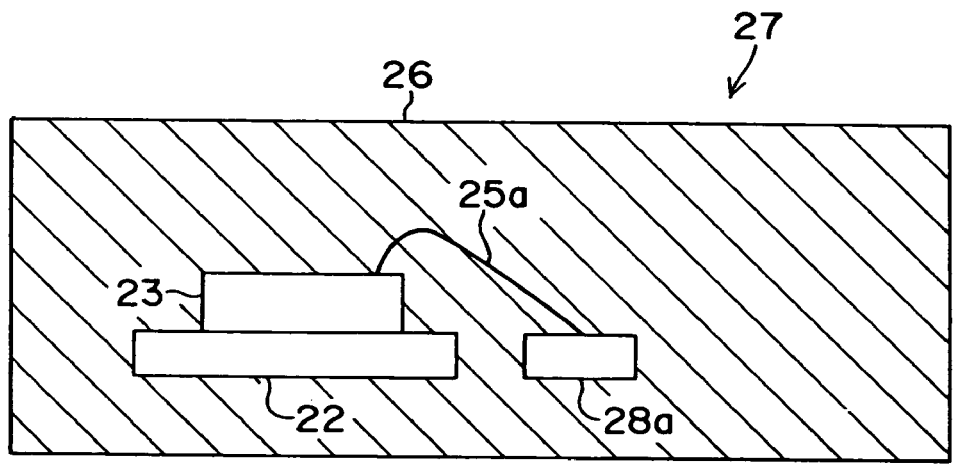
FIG. 2 is a cross sectional view taken along an arrow line B-B' in FIG. 1.

FIG. 2 is a cross sectional view taken along an arrow line B-B' along the ground-bonded gold wire 25a in FIG. 1. As shown in FIG. 2, in the longitudinal section along the ground-bonded gold wire 25a, the lead 21a is structured in a discontinuous manner in the package 27 sealed by the resin 26.

More specifically, the ground-bonding lead section 28 continuing to the island section 22 in the lead 21a is composed of two linear sections forming an L shape. The top end of one of the two liner sections (herein below referred to as first linear section) is connected to the island section 22, while the side edge of the other (herein below referred to as second linear section) is connected to a lead terminal section, and a top portion of the second linear section protruding more than the lead terminal section serves as a wire-bonding region 28a. By this arrangement, in the vertical cross section along the gold wire 25a, a cross section of the resin 26 continuing to the cross section of the wire-bonding region 28a appears on the side of the wire-bonding region 28a to the island section 22. That is, the lead 21a is structured in a discontinued state on the side of the wire-bonding region 28a to the island section 22 in the longitudinal section along the gold wire 25a. The wire-bonding region 28a in the around-bonding lead section 28 is composed of the top portion of the second linear section of the L-shaped two linear sections. Consequently, in the longitudinal section along the gold wire 25a, the cross section of the resin 26 continuing to the cross section of the wire-bonding region 28a appears on the side of the wire-bonding region 28a opposite to the island section 22. That is, the lead 21a is structured in a discontinued state on the side of the wire-bonding region 28a opposite to the island section 22 in the longitudinal section along the gold wire 25a.

Thus, in the present embodiment, the lead 21a with the semiconductor chip 23 mounted thereon is structured so that the lead terminal section continuing to the wire-bonding region 28a is absent on the side of the wire-bonding region 28a opposite to the island section in the longitudinal section along the ground-bonded gold wire 25a. Therefore, the length of a portion of an interface between a bonding section of the gold wire 25a in the lead 21a and the resin 26, the portion in which stress is generated by a difference in coefficient of linear expansion therebetween in the direction along the wire 25a, is shortened, and so the stress applied to the bonding portion of the gold wire 25a is decreased. As a result, it becomes possible to prevent breakage due to changes in ambient temperature from occurring in the bonding section of the gold wire 25a.

Further, the lead 21a with the semiconductor chip 23 mounted thereon is structured so that the island section 22 continuing to the wire-bonding region 28a is absent on the side of the wire-bonding region 28a near the island section 22 in the longitudinal section along the ground-bonded gold wire 25a. Therefore, the length of the bonding portion of the gold wire 25a in the lead 21a in the longitudinal section along the gold wire 25a can be made as short as the width of the second linear section (wire-bonding region 28a) in the ground-bonding lead section 28, and so the stress generated in the interface between the bonding portion of the gold wire 25a and the resin 26 due to a difference in coefficient of linear expansion therebetween can be further decreased.

More specifically, according to the embodiment, the stress generated in between the wire-bonding region 28a in the ground-bonding lead section 28 and the resin 26 is small, and therefore relative side slips will not occur between the wire-bonding region 28a and the resin 26. As a result, it becomes possible to prevent breakage due to changes in ambient temperature from occurring in the bonding section of the gold wire 25a.

Moreover, a width W of the ground-bonding lead section 28 in the lead 21a with the semiconductor chip 23 mounted thereon, i.e., the length of the second linear section out of the two linear sections forming an L shape, is formed wider than a width $W_0$ of the lead terminal section. Therefore, frame clamping during wire bonding can reliably be achieved, resulting in the attainment of a good bonding state of the gold wire 25a.

SECOND EMBODIMENT

Figure 3:
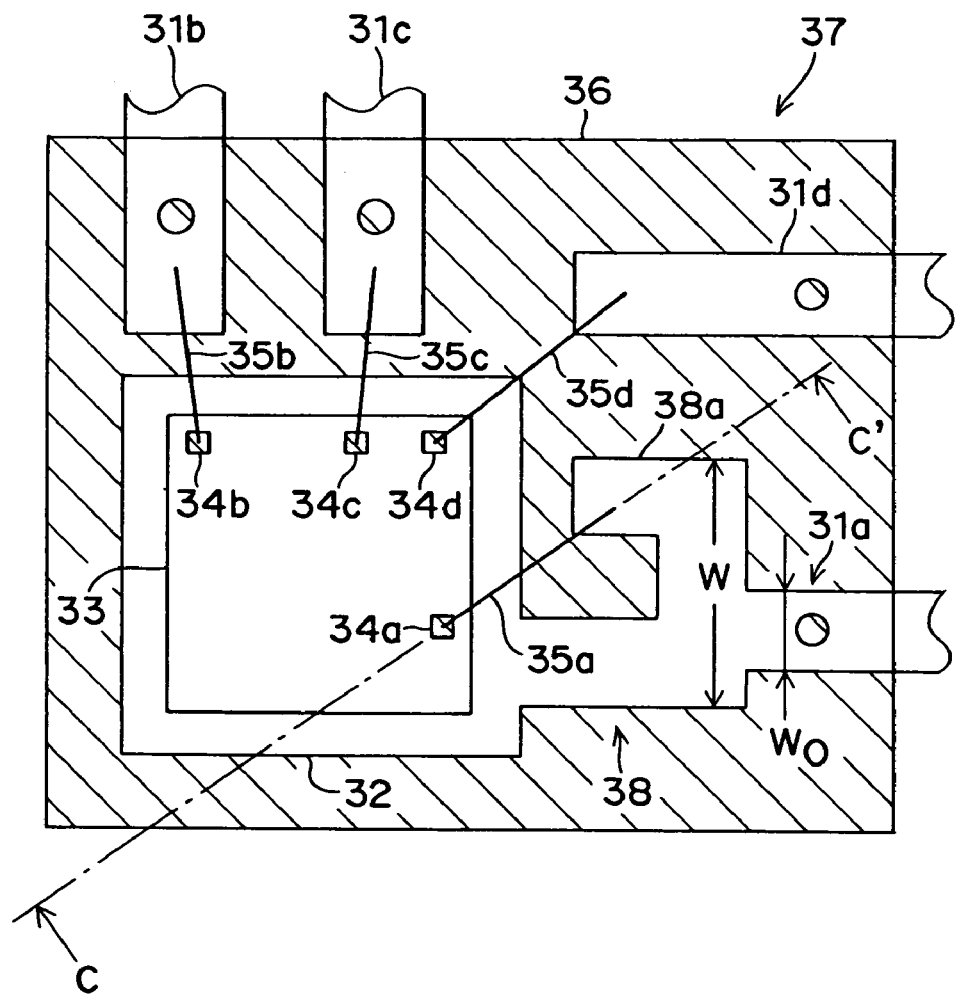
FIG. 3 is a perspective view showing a semiconductor device different from FIG. 1 as viewed from the top.

FIG. 3 is a perspective view showing a semiconductor device in the present embodiment as viewed from the top. In FIG. 3, a semiconductor chip 33 is mounted on an island section (die pad) 32 of a lead 31a in a planar lead frame, and wire-bonding electrodes 34a to 34d provided on the surface of the semiconductor chip 33 are connected to leads 31a to 31d, respectively, through wire bonding by gold wires 35a to 35d. Further, the semiconductor chip 33, the gold wires 35a to 35d and the leads 31a to 31d are sealed by a resin 36 containing a filler of 20 weight % or more and 90 weight % or less to constitute a package 37.

In the case where the electrode 34a among the wire-bonding electrodes 34a to 34d provided on the surface of the semiconductor chip 33 is a ground-bonding electrode, the ground-bonding electrode 34a is wire-bonded (ground-bonded) by the gold wire 35a to a ground-bonding lead section 38 provided in the lead 31a and continuing to the island section 32.

Figure 4:
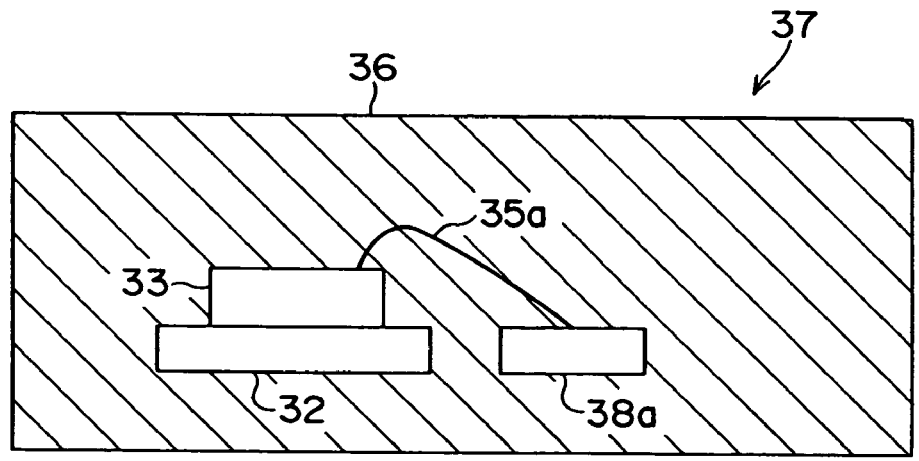
FIG. 4 is a cross sectional view taken along an arrow line C-C' in FIG. 3.

FIG. 4 is a cross sectional view taken along an arrow line C-C' along the ground-bonded gold wire 35a in FIG. 3. As shown in FIG. 4, in the longitudinal section along the ground-bonded gold wire 35a, the lead 31a is structured in a discontinuous manner in the package 37 sealed by the resin 36.

More specifically, the ground-bonding lead section 38 continuing to the island section 32 in the lead 31a has such a shape that the top end portion of the second linear section out of the two linear sections forming an L shape in the ground-bonding lead section 28 in the first embodiment shown in FIG. 1 is connected to a linear section extending toward the island section 32 in parallel with the first linear section (hereinbelow, referred to as third linear section). The third linear section serves as a wire-bonding region 38a. By this, the lead 31a is structured so that in the longitudinal section along the gold wire 35a, the cross section of the resin 36 continuing to the cross section of the wire-bonding region 38a appears on the side of the wire-bonding region 38a near the island section 32. More specifically, the lead 31a is formed in a discontinuous manner at the wire-bonding region 38a on the side of the island section 32 in the longitudinal section along the gold wire 35a.

Moreover, the wire-bonding region 38a in the ground-bonding lead section 38 is structured so that the third linear section extending toward the island section 32 in parallel with the first linear section is connected to the top end portion of the second linear section out of the two linear sections formed in an L shape. Consequently, in the longitudinal section of the package 37 along the ground-bonded gold wire 35a, the cross section of the resin 36 continuing to the cross section of the wire-bonding region 38a appears on the side of the wire-bonding region 38a opposite to the island section 32. That is, the lead 31a is structured so that the lead 31a continuing to the wire-bonding region 38a is absent on the side of the wire-bonding region 38a opposite to the island section in the longitudinal section along the gold wire 35a.

Thus, in the present embodiment, the lead 31a with the semiconductor chip 33 mounted thereon is structured so that the lead terminal section continuing to the wire-bonding region 38a is absent on the side of the wire-bonding region 38a opposite to the island section in the longitudinal section along the ground-bonded gold wire 35a. Further, the lead 31a with the semiconductor chip 33 mounted thereon is structured so that the island section 32 continuing to the wire-bonding region 38a is absent at the wire-bonding region 38a on the side of the island section 32 in the longitudinal section along the ground-bonded gold wire 35a.

Therefore, the length of a bonding portion of the gold wire 35a in the lead 31a in the longitudinal section along the gold wire 35a can be made as short as the width of the third linear section (wire-bonding region 38a) in the ground-bonding lead section 28, and so the stress generated in an interface between the bonding portion of the gold wire 35a and the resin 36 due to a difference in coefficient of linear expansion therebetween can be decreased.

More specifically, according to the embodiment, relative side slips will not occur between the wire-bonding region 38a and the resin 36. As a result, it becomes possible to prevent breakage due to changes in ambient temperature from occurring in the bonding section of the gold wire 35a.

Moreover, a width W of the ground-bonding lead section 38 in the lead 31a with the semiconductor chip 33 mounted thereon, i.e., the length of the second linear section, is formed wider than a width $W_0$ of the lead terminal section. Therefore, frame clamping during wire bonding can reliably be achieved, resulting in the attainment of a good bonding state of the gold wire 35a.

THIRD EMBODIMENT

Figure 5:
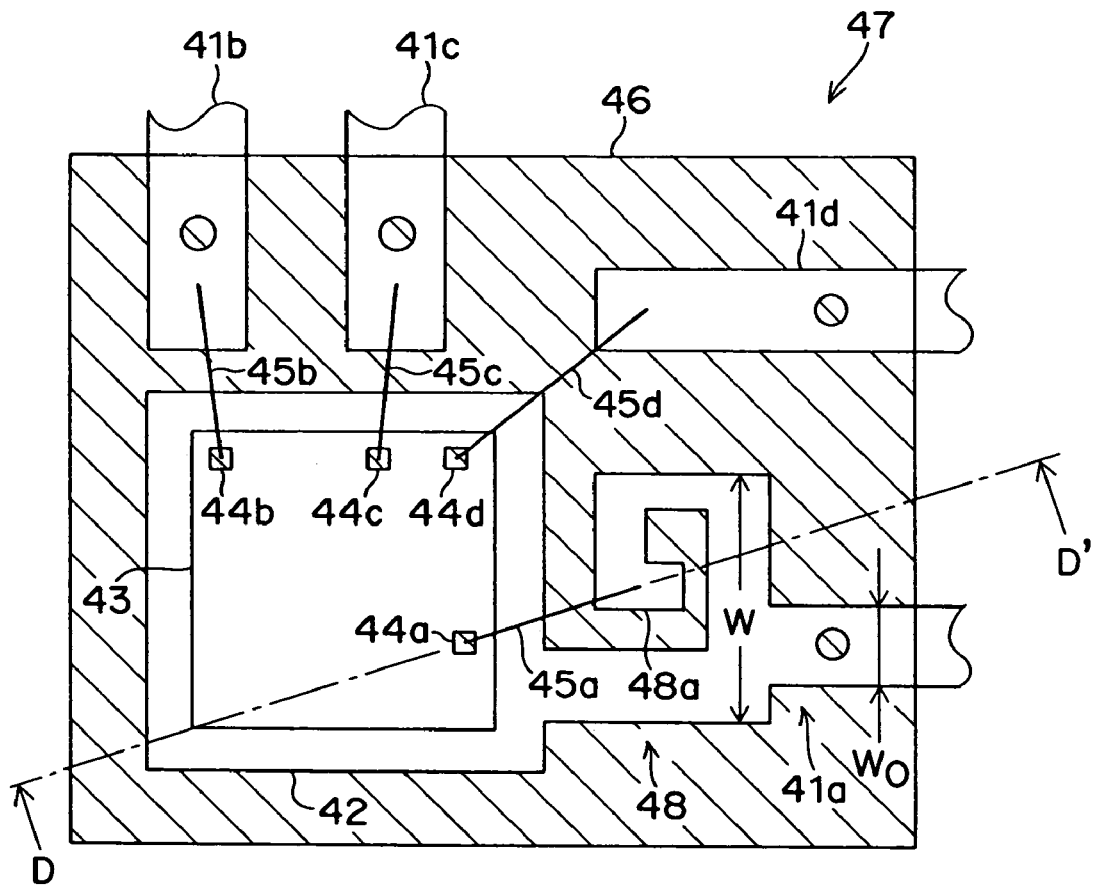
FIG. 5 is a perspective view showing a semiconductor device different from FIG. 1 and FIG. 3 as viewed from the top.

FIG. 5 is a perspective view showing a semiconductor device in the present embodiment as viewed from the top. In FIG. 5, a semiconductor chip 43 is mounted on an island section (die pad) 42 of a lead 41a in a planar lead frame, and wire-bonding electrodes 44a to 44d provided on the surface of the semiconductor chip 43 are connected to leads 41a to 41d, respectively, through wire bonding by gold wires 45a to 45d. Further, the semiconductor chip 43, the gold wires 45a to 45d and the leads 41a to 41d are sealed by a resin 46 containing a filler of 20 weight % or more and 90 weight % or less to constitute a package 47.

In the case where the electrode 44a among the wire-bonding electrodes 44a to 44d provided on the surface of the semiconductor chip 43 is a ground-bonding electrode, the ground-bonding electrode 44a is wire-bonded (ground-bonded) by the gold wire 45a to a ground-bonding lead section 48 provided in the lead 41a and continuing to the island section 42.

Figure 6:
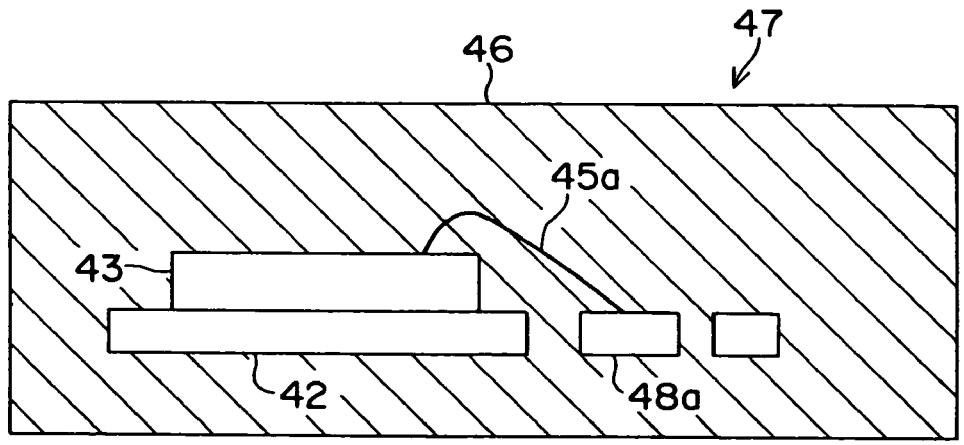
FIG. 6 is a cross sectional view taken along an arrow line D-D' in FIG. 5.

FIG. 6 is a cross sectional view taken along an arrow line D-D' along the ground-bonded gold wire 45a in FIG. 5. As shown in FIG. 6, in the longitudinal section along the ground-bonded gold wire 45a, the lead 41a is structured in a discontinuous manner in the package 47 sealed by the resin 46.

More specifically, the ground-bonding lead section 48 continuing to the island section 42 in the lead 41a has such a shape that the top end portion of the third linear section in the ground-bonding lead section 38 in the second embodiment shown in FIG. 4 is connected to a linear section extending toward the first linear section in parallel with the island section 42 (hereinbelow, referred to as fourth linear section), and further a top end section of the fourth linear section is connected to a linear section extending toward the second linear section in parallel with the first linear section (hereinbelow, referred to as fifth linear section). The fifth linear section serves as a wire-bonding region 48a. By this, the lead 41a is structured so that in the longitudinal section along the gold wire 45a, the cross section of the resin 46 continuing to the cross section of the wire-bonding region 48a appears at the wire-bonding region 48a on the side of the island section 42. More specifically, the lead 41a is formed in a discontinuous manner at the wire-bonding region 48a on the side of the island section 42 in the longitudinal section along the gold wire 45a.

Moreover, the ground-bonding lead section 48 in the lead 41a is structured with use of five linear sections from the first linear section to the fifth linear section in such a way that the top end section of the first linear section is connected to the second linear section in the direction perpendicular to the first linear section, the top end section of the second linear section is connected to the third linear section in the direction perpendicular to the second linear section, the top end section of the third linear section is connected to the fourth linear section in the direction perpendicular to the third linear section, the top end section of the fourth linear section is connected to the fifth linear section in the direction perpendicular to the fourth linear section, and these five linear sections are linked in sequence in a spiral shape. The innermost fifth linear section among the five linear sections connected in a spiral shape constitutes the wire-bonding region 48a.

Consequently, in the longitudinal section of the package 47 along the ground-bonded gold wire 45a, the cross section of the resin 46 continuing to the cross section of the wire-bonding region 48a appears on the side of the wire-bonding region 48a opposite to the island section 42. That is, the lead 41a is structured so that the lead 41a continuing to the wire-bonding region 48a is absent at the wire-bonding region 48a on the side of the island section in the longitudinal section along the gold wire 45a.

Thus, in the present embodiment, the lead 41a with the semiconductor chip 43 mounted thereon is structured so that the lead terminal section continuing to the wire-bonding region 48a is absent on the side of the wire-bonding region 48a opposite to the island section in the longitudinal section along the ground-bonded gold wire 45a. Further, the lead 41a with the semiconductor chip 43 mounted thereon is structured so that the island section 42 continuing to the wire-bonding region 48a is absent at the wire-bonding region 48a on the side of the island section 42 in the longitudinal section along the ground-bonded gold wire 45a.

Therefore, the length of a bonding portion of the gold wire 45a in the lead 41a in the longitudinal section along the gold wire 45a can be made as short as the width of the fifth linear section (wire-bonding region 48a) in the ground-bonding lead section 48, and so the stress generated in an interface between the bonding portion of the gold wire 45a and the resin 46 due to a difference in coefficient of linear expansion therebetween is decreased.

More specifically, according to the embodiment, relative side slips will not occur between the wire-bonding region 48a and the resin 46. As a result, it becomes possible to prevent breakage due to changes in ambient temperature from occurring in the bonding section of the gold wire 45a.

Moreover, a width W of the ground-bonding lead section 48 in the lead 41a with the semiconductor chip 43 mounted thereon, i.e., the length of the second linear section, is formed wider than a width $W_0$ of the lead terminal section. Therefore, frame clamping during wire bonding can reliably be achieved, resulting in the attainment of a good bonding state of the gold wire 45a.

FOURTH EMBODIMENT

Figure 7:
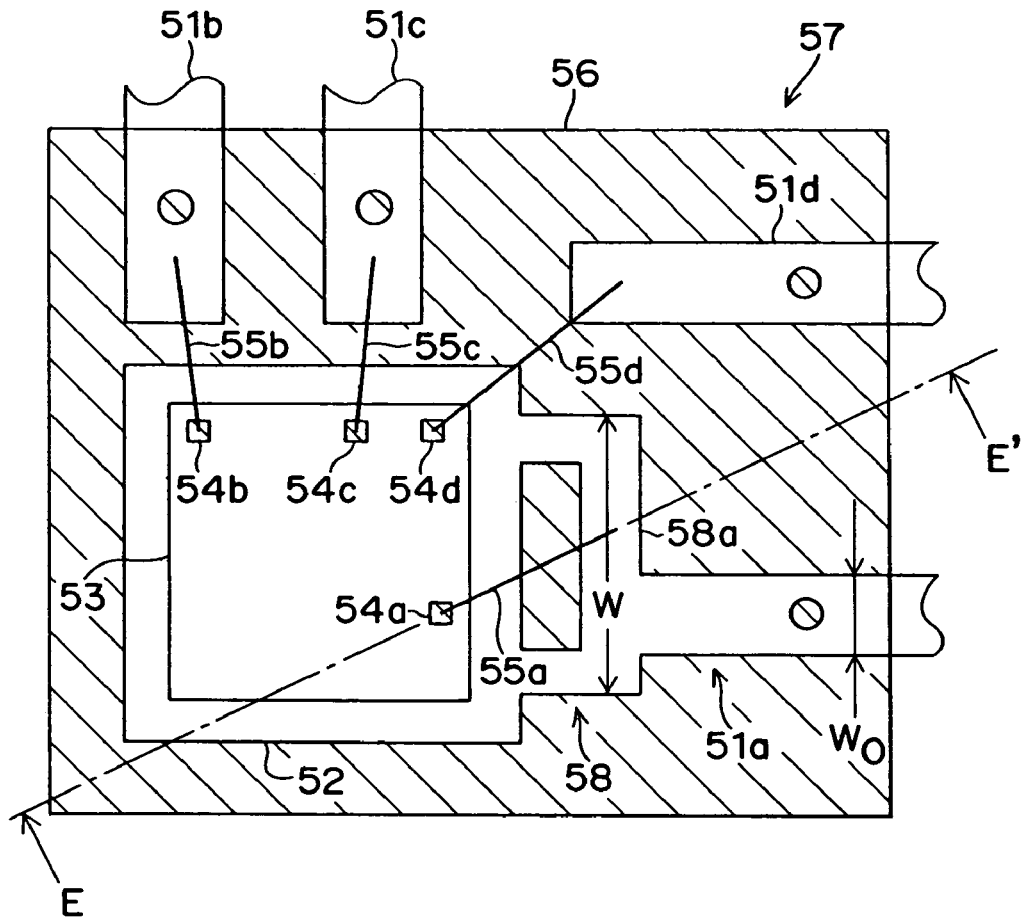
FIG. 7 is a perspective view showing a semiconductor device different from FIG. 1, FIG. 3 and FIG. 5 as viewed from the top.

FIG. 7 is a perspective view showing a semiconductor device in the present embodiment as viewed from the top. In FIG. 7, a semiconductor chip 53 is mounted on an island section (die pad) 52 of a lead 51a in a planar lead frame, and wire-bonding electrodes 54a to 54d provided on the surface of the semiconductor chip 53 are connected to leads 51a to 51d, respectively, through wire bonding by gold wires 55a to 55d. Further, the semiconductor chip 53, the gold wires 55a to 55d and the leads 51a to 51d are sealed by a resin 56 containing a filler of 20 weight % or more and 90 weight % or less to constitute a package 57.

In the case where the electrode 54a among the wire-bonding electrodes 54a to 54d provided on the surface of the semiconductor chip 53 is a ground-bonding electrode, the ground-bonding electrode 54a is wire-bonded (ground-bonded) by the gold wire 55a to a ground-bonding lead section 58 provided in the lead 51a and continuing to the island section 52.

Figure 8:
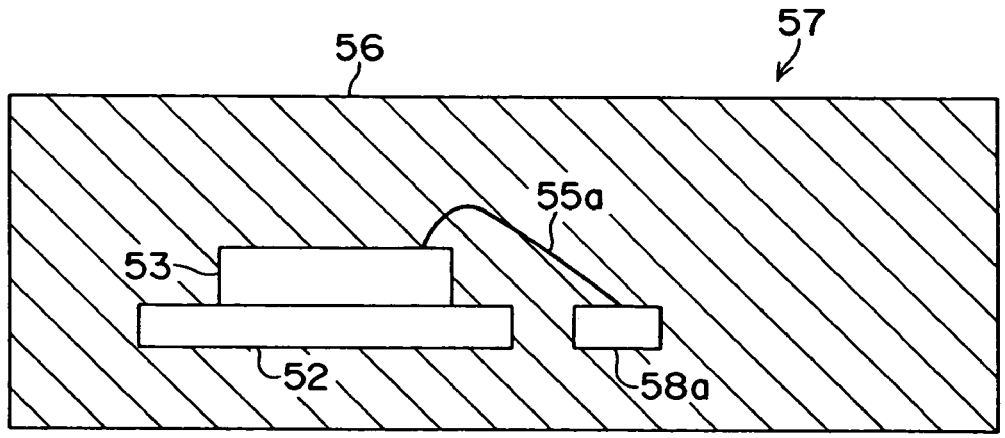
FIG. 8 is a cross sectional view taken along an arrow line E-E' in FIG. 7.

FIG. 8 is a cross sectional view taken along an arrow line E-E' along the ground-bonded gold wire 55a in FIG. 7. As shown in FIG. 8, in the longitudinal section along the ground-bonded gold wire 55a, the lead 51a is structured in a discontinuous manner in the package 57 sealed by the resin 56.

More specifically, the ground-bonding lead section 58 continuing to the island section 52 in the lead 51a is structured so that a rectangular through hole is provided along the island section 52 in a rectangular plate body whose side with a length "W" is connected to the island section 52. A lead terminal section of the lead 51a extends outward from a side face of a linear section facing the island section 52 across the rectangular through hole. In the ground-bonding lead section 58 having this structure, a region of the linear section excluding a connection portion to the lead terminal section and a connection portion to the island section 52 constitutes a wire-bonding region 58a. With this structure, the lead 51a is structured so that in the longitudinal section along the gold wire 55a, the cross section of the resin 56 continuing to the cross section of the wire-bonding region 58a appears at the wire-bonding region 58a on the side of the island section 52. That is, the lead 51a is formed in a discontinued state at the wire-bonding region 58a on the side of the island section 42 in the longitudinal section along the gold wire 55a.

Moreover, the rectangular through hole is provided along the island section 52 in the ground-bonding lead section 58 in the lead 51a, and a region of the linear section facing the island section 52 across the rectangular through hole, the region excluding the connection portion to the lead terminal section and the connection portion to the island section 52, constitutes the wire-bonding region 58a. Therefore, in the longitudinal section of the package 57 along the ground-bonded gold wire 55a, the cross section of the resin 56 continuing to the cross section of the wire-bonding region 58a appears on the side of the wire-bonding region 58a opposite to the island section 52. That is, the lead 51a is structured so that the lead 51a continuing to the wire-bonding region 58a is absent on the side of the wire-bonding region 58a opposite to the island section in the longitudinal section along the gold wire 55a.

Thus, in the present embodiment, the lead 51a with the semiconductor chip 53 mounted thereon is structured so that the lead terminal section continuing to the wire-bonding region 58a is absent on the side of the wire-bonding region 58a opposite to the island section in the longitudinal section along the ground-bonded gold wire 55a. Further, the lead 51a with the semiconductor chip 53 mounted thereon is structured so that the island section 52 continuing to the wire-bonding region 58a is absent at the wire-bonding region 58a on the side of the island section 52 in the longitudinal section along the ground-bonded gold wire 55a.

Therefore, the length of a bonding portion of the gold wire 55a in the lead 51a in the longitudinal section along the gold wire 55a can be made as short as the width (horizontal length in FIG. 7) of the linear section (wire-bonding region 58a) in the ground-bonding lead section 58 facing the island section 52 across the through hole, and so the stress generated in an interface between the bonding portion of the gold wire 55a and the resin 56 due to a difference in coefficient of linear expansion therebetween is decreased.

More specifically, according to the embodiment, relative side slips will not occur between the wire-bonding region 58a and the resin 56. As a result, it becomes possible to prevent breakage due to changes in ambient temperature from occurring in the bonding section of the gold wire 55a.

Moreover, a width W of the ground-bonding lead section 58 in the lead 51a with the semiconductor chip 53 mounted thereon, i.e., the length of the side of the ground-bonding lead section 58, is formed wider than a width $W_0$ of the lead terminal section. Therefore, frame clamping during wire bonding can reliably be achieved, resulting in the attainment of a good bonding state of the gold wire 55a.

FIFTH EMBODIMENT

Figure 9:
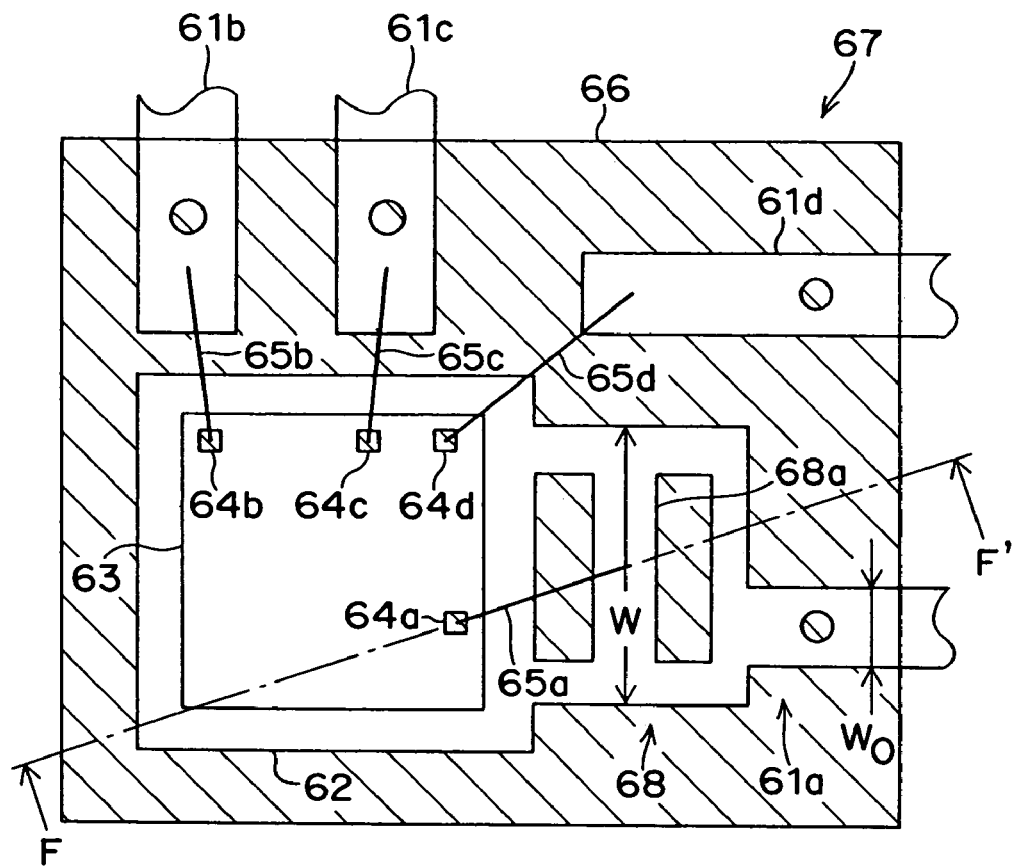
FIG. 9 is a perspective view showing a semiconductor device different from FIG. 1, FIG. 3, FIG. 5 and FIG. 7 as viewed from the top.

FIG. 9 is a perspective view showing a semiconductor device in the present embodiment as viewed from the top. In FIG. 9, a semiconductor chip 63 is mounted on an island section (die pad) 62 of a lead 61a in a planar lead frame, and wire-bonding electrodes 64a to 64d provided on the surface of the semiconductor chip 63 are connected to leads 61a to 61d, respectively, through wire bonding by gold wires 65a to 65d. Further, the semiconductor chip 63, the gold wires 65a to 65d and the leads 61a to 61d are sealed by a resin 66 containing a filler of 20 weight % or more and 90 weight % or less to constitute a package 67.

In the case where the electrode 64a among the wire-bonding electrodes 64a to 64d provided on the surface of the semiconductor chip 63 is a ground-bonding electrode, the ground-bonding electrode 64a is wire-bonded (ground-bonded) by the gold wire 65a to a ground-bonding lead section 68 provided in the lead 61a and continuing to the island section 62.

Figure 10:
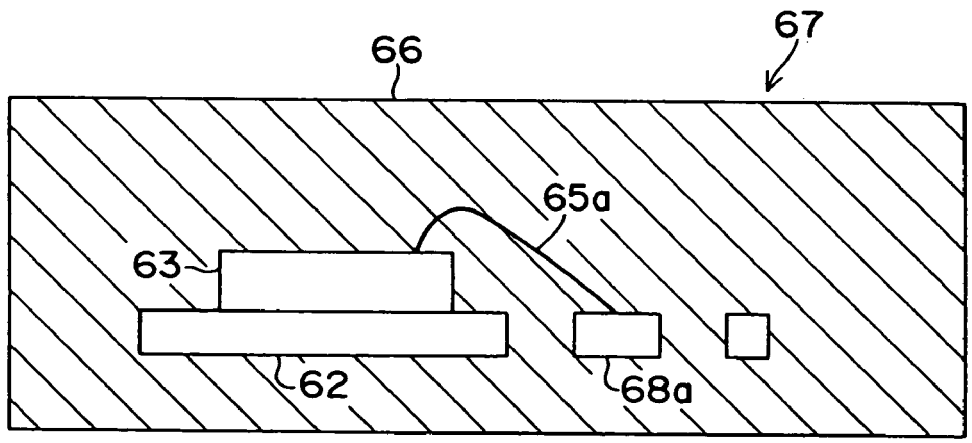
FIG. 10 is a cross sectional view taken along an arrow line F-F' in FIG. 9.
Figure 11:
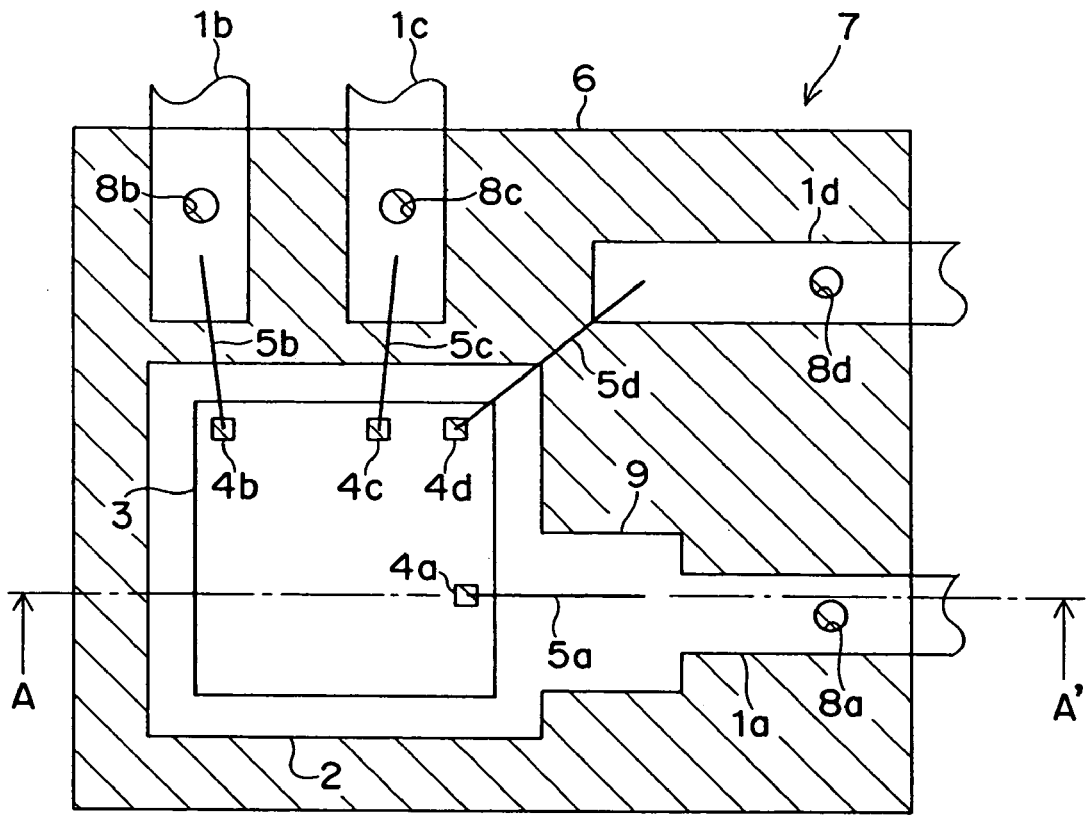
FIG. 11 is a perspective view showing a conventional semiconductor device having a resin-sealed package structure as viewed from the top.
Figure 12:
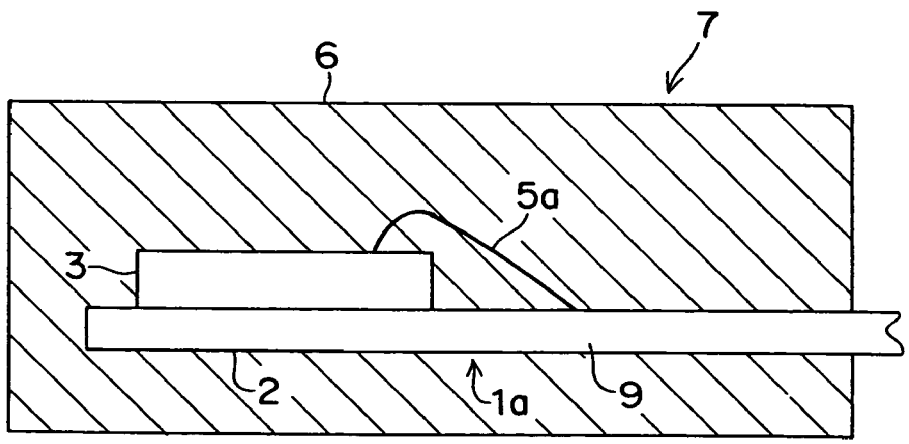
FIG. 12 is a cross sectional view taken along an arrow line A-A' in FIG. 11.
Figure 13:
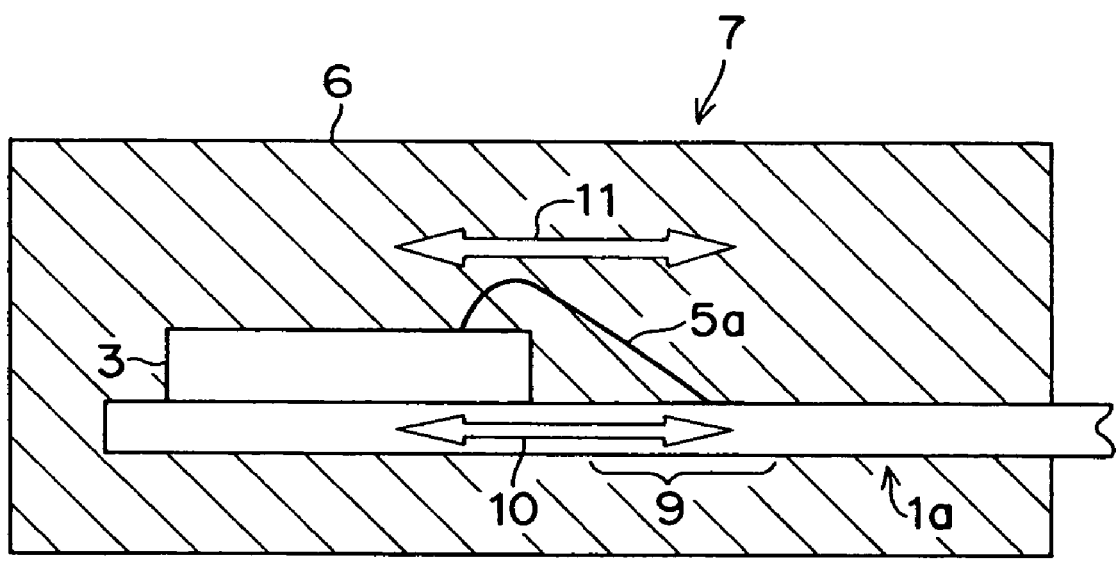
FIG. 13 is an explanatory view explaining a reason why open failures tend to occur in a bonding section of a ground wire.

FIG. 10 is a cross sectional view taken along an arrow line F-F' along the ground-bonded gold wire 65a in FIG. 9. As shown in FIG. 10, in the longitudinal section along the ground-bonded gold wire 65a, the lead 61a is structured in a discontinuous manner in the package 67 sealed by the resin 66.

More specifically, the ground-bonding lead section 68 continuing to the island section 62 in the lead 61a is structured so that two rectangular through holes is parallely provided along the island section 52 in a rectangular plate body whose side with a length "W" is connected to the island section 62. A region of a linear section between the two rectangular through holes excluding a connection portion to the island section 62 constitutes a wire-bonding region 68a. With this structure, the lead 61a is structured so that in the longitudinal section along the gold wire 65a, the cross section of the resin 66 continuing to the cross section of the wire-bonding region 68a appears at the wire-bonding region 68a on the side of the island section 62. That is, the lead 61a is formed in a discontinued state at the wire-bonding region 68a on the side of the island section 62 in the longitudinal section along the gold wire 65a.

Moreover, the two rectangular through holes are provided along the island section 62 in the ground-bonding lead section 68 in the lead 61a, and a region of the linear section between the two through holes excluding the connection portion to the island section 62 constitutes the wire-bonding region 68a. Therefore, in the longitudinal section of the package 67 along the ground-bonded gold wire 65a, the cross section of the resin 66 continuing to the cross section of the wire-bonding region 68a appears on the side of the wire-bonding region 68a opposite to the island section 62. That is, the lead 61a is structured so that the lead 61a continuing to the wire-bonding region 68a is absent on the side of the wire-bonding region 68a opposite to the island section in the longitudinal section along the gold wire 65a.

Thus, in the present embodiment, the lead 61a with the semiconductor chip 63 mounted thereon is structured so that the lead terminal section continuing to the wire-bonding region 68a is absent on the side of the wire-bonding region 68a opposite to the island section in the longitudinal section along the ground-bonded gold wire 65a. Further, the lead 61a with the semiconductor chip 63 mounted thereon is structured so that the island section 62 continuing to the wire-bonding region 68a is absent at the wire-bonding region 68a on the side of the island section 62 in the longitudinal section along the ground-bonded gold wire 65a.

Therefore, the length of a bonding portion of the gold wire 65a in the lead 61a in the longitudinal section along the gold wire 65a can be made as short as the width (horizontal length in FIG. 9) of the linear section (wire-bonding region 68a) between the two through holes in the ground-bonding lead section 68, and so the stress generated in an interface between the bonding portion of the gold wire 65a and the resin 66 due to a difference in coefficient of linear expansion therebetween is decreased.

More specifically, according to the embodiment, relative side slips will not occur between the wire-bonding region 68a and the resin 66. As a result, it becomes possible to prevent breakage due to changes in ambient temperature from occurring in the bonding section of the gold wire 65a.

Moreover, a width W of the ground-bonding lead section 68 in the lead 61a with the semiconductor chip 63 mounted thereon, i.e., the length of the side of the ground-bonding lead section 68, is formed wider than a width $W_0$ of the lead terminal section. Therefore, frame clamping during wire bonding can reliably be achieved, resulting in the attainment of a good bonding state of the gold wire 65a.

As described above, according to each of the embodiments, it becomes possible to prevent relative side slips from generating in the interfaces between the wire-bonding regions 28a to 68a in the leads 21a to 61a with the semiconductor chips 23 to 63 mounted thereon and the resins 26 to 66 due to a difference in coefficient of linear expansion therebetween. Therefore, it becomes possible to eliminate ground-wire-bonding failures on the leads 21a to 61a which have the island sections 22 to 62 for mounting the semiconductor chips 23 to 63 thereon and to provide highly reliable semiconductor devices.

Further, in each of the embodiments, the width of the wire-bonding regions 28a to 68a, i.e., the length of the wire-bonding regions 28a to 68a in the direction perpendicular to the extending direction of the wire-bonding regions 28a to 68a, is set at 0.3 mm or more and 0.6 mm or less. This can secure the region for allowing bonding by the wires 25a to 65a. At the same time, minor stress generated in the interfaces between the wire-bonding regions and the resins 26 to 66 is relaxed by deformation of the wire-bonding regions 28a to 68a in the direction along the ground-bonded gold wires 25a to 65a, the deformation being small enough to prevent breakage of the gold wires 25a to 65a, so that stress cannot be applied to the bonding portions of the gold wires 25a to 65a in the wire-bonding regions 28a to 68a.

The size of the semiconductor chips 23 to 63 is as large as 0.5 mm to 2.5 mm on a side and 0.1 mm to 0.4 mm in thickness, the size being typically found in semiconductor chips. In this case, the surface of the semiconductor chips 23 to 63 has poor adhesiveness to the resins 26 to 66, and therefore side slips tend to occur by stress in their interfaces. Further, the larger the size of the semiconductor chips 23 to 63 is, the more noticeable the occurrence of side slips by the stress becomes. However, in each of the embodiments, the length of the portions of the leads 21a to 61a on which the semiconductor chips 23 to 63 are mounted along the gold wires 25a to 65a can be made as short as the width of the island sections 22 to 62, and this makes it possible to decrease the stress generated between the portions of the leads 21a to 61a on which the semiconductor chips 23 to 63 are mounted and the resins 26 to 66 due to a difference in coefficient of linear expansion therebetween and to decrease further the stress generated in the interfaces between the semiconductor chips 23 to 63 and the resins 26 to 66.

Therefore, side slips occurring in the interfaces between the semiconductor chips 23 to 63 and the resins 26 to 66 can be suppressed and the reliability of the bonding sections of the gold wires 25a to 65a in the semiconductor chips 23 to 63 can be ensured.

In each of the embodiments, the resins 26 to 66 for sealing the semiconductor chips 23 to 63, the gold wires 25a to 25d; 35a to 35d; 45a to 45d; 55a to 55d; 65a to 65d, and the leads 21a to 21d; 31a to 31d; 41a to 41d; 51a to 51d; 61a to 61d contain a filler of 20 weight % or more and 90 weight % or less.

In semiconductor devices used in optical communication apparatuses and the like, translucent (transparent) resins are used for resin sealing since light needs to be transmitted. In that case, adding fillers to resins damages translucency, and therefore in a general way, translucent resins hardly contains fillers.

However, the object of each of the embodiments is to provide a semiconductor device which is free from wire disconnection even under severe conditions of 500 or more temperature change cycles within a range between −40° C. and 120° C. so that the semiconductor device is applicable to in-car equipment, and therefore in order to attain high reliability in terms of the wire disconnection, the sealing resins (thermosetting epoxy resin is used in each of the embodiments) 26 to 66 contain a filler so as to reduce the coefficient of linear expansion of the resins 26 to 66.

Used as the filler contained in the resins 26 to 66 in each of the embodiments is transparent silica ($SiO_2$) having a generally spherical shape (approx. 70 µm in diameter) with a smooth surface in order to minimize the damage on the translucency of the resins 26 to 66. Under these conditions, a filler content in the resins 26 to 66 is set at 20 weight % or more, so that the coefficient of linear expansion of the thermosetting epoxy resins 26 to 56 can be decreased from $6.2 \times 10^{-5}$ which is a coefficient of linear expansion without the filler, and be closer to the coefficient of linear expansion of the leads 21a to 61a ($1.7 \times 10^{-5}$ in the case of copper-based alloy) without largely damaging the translucency. As a result, occurrence of breakage in the bonding sections of the gold wires 25a to 65a can be further reduced.

It is to be noted that the silica ($SiO_2$) is a transparent material and its shape is arranged to be a generally spherical shape with a smooth surface. Consequently, even if a filler content in the thermosetting epoxy resins 26 to 56 is 90 weight % or more, the thermosetting epoxy resins 26 to 56 can still function as translucent resins. However, in consideration of attaining the translucency sufficient enough for optical semiconductor devices to fully function, keeping manufacturing costs low and the like, a filler content should preferably be 90 weight % or less.

Although in each of the embodiments, thermosetting epoxy resins are used as the sealing resins 26 to 66 containing a filler of 20 weight % or more and 90 weight % or less to constitute the packages 27 to 57, other thermosetting resins, thermoplastics resins and cold setting resins are also usable.

Moreover, each lead frame including the island section, the ground-bonding lead section and the lead terminal section are formed from a copper-based or an iron-based alloy, and at least a region of each ground-bonding lead section for connecting each gold wire is given plating suitable for wire bonding. Therefore, bonding of each gold wire to each bonding lead section can be achieved more reliably, and occurrence of breakage in the bonding section of each gold wire can be prevented even more reliably.

Moreover, in each of the embodiments, both the first structure in which the lead terminal sections continuing to the wire-bonding regions 28a to 68a are absent on the side of the wire-bonding regions 28a to 68a opposite to the island sections in the longitudinal section along the ground-bonded gold wires 25a to 65a, and the second structure in which the island sections 22 to 62 continuing to the wire-bonding regions 28a to 68a are absent at the wire-bonding regions 28a to 68a on the side of the island sections 22 to 62 in the longitudinal section along the ground-bonded gold wires 25a to 65a are implemented. However, the problem can sufficiently be solved only with the first structure.

Moreover, according to each of the embodiments, it becomes possible to eliminate open failures in the bonding section of the ground wire generated due to a difference in coefficient of linear expansion not only during the heat cycle test but also by changes in ambient temperature.

Moreover, in the third embodiment, the ground-bonding lead section 48 in the lead 41*a* is composed of five linear sections connected in sequence in a spiral shape. However, the number of linear sections connected in the spiral shape is not limited to five.

Moreover, in each of the embodiments, the present invention has been described with an example in which the present invention is applied to the ground bonding purpose. However, it should naturally be understood that the present invention is applicable to general wire bonding other than the ground bonding.

Moreover, the semiconductor device in each of the embodiments is suitable for use in electronic equipment including digital TVs (Televisions), digital BS (Broadcasting Satellite) tuners, CS (Communication Satellite) tuners, DVD (Digital Versatile Discs) players, CD (Compact Disc) players, AV (Audio Visual) amplifiers, audios, personal computers, personal computer peripherals, portable phones, and PDAs (Personal Digital Assistants). Further, the semiconductor device in each of the embodiments is suitable for use in electronic equipment in an environment with a wide operating temperature range such as in-car equipment including car audios, car navigation systems and sensors, and robot sensors and control equipment used in factories.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A semiconductor device, comprising:
    a lead including an island section with a semiconductor chip mounted thereon, a bonding lead section continuing to the island section, and a lead terminal section continuing to the bonding lead section;
    a wire for electrically connecting an electrode provided on the semiconductor chip and the bonding lead section; and
    a resin sealing the semiconductor chip, the lead and the wire and containing a filler of 20 weight % or more and 90 weight % or less, wherein
    in a cross section of the semiconductor device that results when the semiconductor device is cut (i) in a direction vertical to a mounting surface of the semiconductor chip in the island section and (ii) along the wire, a cross section of the resin that continues to a cross section of the bonding lead section appears on the side of the bonding lead section opposite to the island section.

2. The semiconductor device according to claim 1, wherein the filler has a generally spherical shape with a smooth surface.

3. The semiconductor device according to claim 1, wherein
    in the cross section of the semiconductor device, a cross section of the resin continuing to a cross section of the bonding lead section appears at the bonding lead section on a side of the island section.

4. The semiconductor device according to claim 3,
    wherein the bonding lead section includes:
    a first linear section formed in a linear shape and having one end connected to the island section; and
    a second linear section formed in a linear shape and having one end connected to the other end section of the first linear section so as to extend along the island section,
    wherein the one end side of the second linear section is connected to the lead terminal section while a top end portion of the second linear section has a wire-bonding region for connecting the wire.

5. The semiconductor device according to claim 3,
    wherein the bonding lead section includes:
    a first linear section formed in a linear shape and having one end connected to the island section;
    a second linear section formed in a linear shape and having one end connected to the other end section of the first linear section so as to extend along the island section, and
    a third linear section formed in a linear shape and having one end connected to the other end section of the second linear section so as to extend toward the island section,
    wherein the one end side of the second linear section is connected to the lead terminal section, and
    wherein a top end potion of the third linear section has a wire-bonding region provided for connecting the wire.

6. The semiconductor device according to claim 3,
    wherein the bonding lead section is structured so that four or more linear sections formed in a linear shape are linked in a spiral shape, a top end of the outermost linear section positioned at a forefront among a plurality of the linear sections linked in a spiral shape is connected to the island section, and the linear section farthest from the island section among a plurality of the linear sections linked in a spiral shape is connected to the lead terminal section, and
    wherein a top end portion of the innermost linear section positioned at a rear among a plurality of the linear sections linked in a spiral shape has a wire-bonding region provided for connecting the wire.

7. The semiconductor device according to claim 3,
    wherein the bonding lead section is structured so that a side of a rectangular body which is wider than a side of the lead terminal section is connected to the lead terminal section while a side opposite to the side is connected to the island section, and that the rectangular body has a rectangular through hole provided along the island section, and
    wherein a wire-bonding region for connecting the wire is provided in a region of the rectangular body facing the island section across the through hole excluding a connection portion to the lead terminal section and a connection portion to the island section.

8. The semiconductor device according to claim 3,
    wherein the bonding lead section is structured so that a side of a rectangular body which is wider than a side of the lead terminal section is connected to the lead terminal section while a side opposite to the side is connected to the island section, and that the rectangular body has two rectangular through holes provided along the island section, and
    wherein a wire-bonding region for connecting the wire is provided in a region between the two through holes in the rectangular body excluding a connection portion to the island section.

9. The semiconductor device according to claim 3,
    wherein the bonding lead section has a wire-bonding region for connecting the wire, and
    wherein a width of the wire-bonding region is 0.3 mm or more and 0.6 mm or less.

10. The semiconductor device according to claim 3,
    wherein a size of the semiconductor chip is 0.5 mm or more and 2.5 mm or less on a side and is 0.1 mm or more and 0.4 mm or less in thickness.

11. A lead frame used in the semiconductor device according to claim 1, comprising:
   an island section on which a semiconductor chip is to be mounted;
   a bonding lead section which continues to the island section and which is to be electrically connected to an electrode provided on the semiconductor chip by a wire; and a lead terminal section continuing to the bonding lead section and extending on an opposite side of the island section,
   wherein in a cross section which is vertical to a mounting surface of the semiconductor chip in the island section and which goes through the bonding lead section and the island section, the bonding lead section has a region not continuing to the island section and to the lead terminal section.

12. The lead frame according to claim 11,
   the region of the bonding lead section not continuing to the island section and to the lead terminal section is constituted of a protruding section away from the island section and protruding more than the lead terminal section in a direction intersecting with an extending direction of the lead terminal section.

13. The lead frame according to claim 11,
   wherein the bonding lead section has a through hole extending along the island section, and
   wherein the region of the bonding lead section not continuing to the island section and to the lead terminal section is constituted of a region facing the island section across the through hole.

14. The lead frame according to claim 11,
   wherein the lead frame including the island section, the bonding lead section and the lead terminal section is formed from a copper-based or iron-based alloy, and
   wherein at least a region of the bonding lead section to which the wire is connected is given plating suitable for wire bonding.

15. Electronic equipment using the semiconductor device according to claim 1.

* * * * *